(12) United States Patent
Carpi et al.

(10) Patent No.: US 6,888,260 B2
(45) Date of Patent: May 3, 2005

(54) ALIGNMENT OR OVERLAY MARKS FOR SEMICONDUCTOR PROCESSING

(75) Inventors: Enio Carpi, Fishkill, NY (US); Shoaib Hasan Zaidi, Poughkeepsie, NY (US)

(73) Assignee: Infineon Technologies Aktiengesellschaft, Munich (DE)

( * ) Notice: Subject to any disclaimer, the term of this patent is extended or adjusted under 35 U.S.C. 154(b) by 89 days.

(21) Appl. No.: 10/249,530

(22) Filed: Apr. 17, 2003

(65) Prior Publication Data
US 2004/0207097 A1 Oct. 21, 2004

(51) Int. Cl.$^7$ .............................................. H01L 23/544
(52) U.S. Cl. ...................... 257/797; 438/401; 438/462; 438/975
(58) Field of Search ........................ 257/797; 438/401, 438/462, 975

(56) References Cited

U.S. PATENT DOCUMENTS

| | | | | |
|---|---|---|---|---|
| 4,037,969 A | * | 7/1977 | Feldman et al. | 356/401 |
| 4,178,701 A | * | 12/1979 | Sadler | 434/286 |
| 4,326,805 A | * | 4/1982 | Feldman et al. | 356/399 |
| 4,545,683 A | * | 10/1985 | Markle | 356/400 |
| 4,614,433 A | * | 9/1986 | Feldman et al. | 356/401 |
| 5,319,444 A | * | 6/1994 | Saitoh et al. | 356/401 |
| 5,877,562 A | * | 3/1999 | Sur et al. | 257/797 |

* cited by examiner

Primary Examiner—Michael Tran
Assistant Examiner—Andy Huynh
(74) Attorney, Agent, or Firm—Slater & Matsil, L.L.P.

(57) ABSTRACT

An alignment or overlay mark with improved signal to noise ratio is disclosed. Improved signal-to-noise ratio results in greater depth of focus, thus improving the performance of the alignment mark. The alignment mark comprises a zone plate having n concentric alternating opaque and non-opaque rings. Light diffracted by either the odd or even rings are cancelled while light diffracted by the other of the odd or even rings are added.

37 Claims, 4 Drawing Sheets

Zone Plate Radius
f=5 mm, λ = 500 nm

ALIGNMENT OR OVERLAY MARKS FOR SEMICONDUCTOR PROCESSING

BACKGROUND OF INVENTION

The fabrication of integrated circuits (ICs) involves the formation of features on a substrate that make up circuit components, such as transistors, resistors and capacitors, and the interconnection of such components. To form the features, layers are repeatedly deposited on the substrate and patterned as desired. A plurality of ICs are formed on a semiconductor substrate, such as a silicon wafer, in parallel.

Lithographic techniques are used to pattern the device layer or layers. Such techniques use an exposure source to project a light image from a mask or reticle onto a photoresist (resist) layer formed on the surface of the wafer. The light illuminates the resist layer, exposing it with the desired pattern. Depending on whether a positive or negative tone resist is used, the exposed or unexposed portions of the resist layer are removed. The portions not protected by the resist are then etched to form the features in the substrate.

To ensure that the features are formed in the desired location on the wafer, the wafer and reticle need to be properly aligned. To facilitate alignment, alignment marks are formed on the wafer and reticle. The alignment marks generate a diffraction pattern when scanned by a laser alignment source from an alignment system. Typically, the alignment source is part of the lithographic tool, such as a stepper. The diffraction pattern is reflected and sensed by an alignment sensor which records the position of the marks. The stepper shifts the wafer stage (e.g., x, y and/or rotationally) until the wafer and reticle marks overlay each other.

During a process flow for fabricating an IC, numerous lithographic steps are required. Overlay measurements are typically performed to verify alignment of the different layers. Alignment or overlay marks are formed on the different layers to facilitate overlay measurements. The relative positions of the overlay marks on the different layers are measured. The sets of overlay marks are positioned such that they overlay each other if the layers are properly aligned.

FIG. 1 shows a conventional alignment mark 101. The alignment mark comprises plurality of straight lines 120 separated by spaces 130, producing an alignment mark grating. However, such conventional alignment mark designs suffer from poor signal-to-noise ratio due to variations in the stack of layers on the wafer. Moreover, this problem is exacerbated by the fact that processes are optimized for performance and not irradiance or detection of alignment marks. Alignment mark integrity is thereby compromised which adversely affects overlay measurement capabilities.

From the foregoing discussion, it is desirable to provide an alignment mark design which improves overlay measurement performance.

SUMMARY OF INVENTION

The invention relates generally to alignment marks. The alignment marks are used in, for example, semiconductor processing, such as forming DRAM ICs. In one embodiment, an alignment mark comprises a zone plate. The zone plate includes concentric alternating opaque and non-opaque rings. The use of zone plates increases signal to noise ratio over conventional alignment marks.

In one embodiment, the concentric rings comprise circular shaped concentric rings. The rings are configured such that light diffracted by either the odd or even rings are cancelled and the light diffracted by the other of the odd or even rings are added. The radius Rm of the rings, in one embodiment, are defined by the square root of m×f×λ, where m is the ring number within the zone plate, f is equal to the focal length, and λ is equal to the wavelength of the light source.

DETAILED DESCRIPTION

The invention relates generally to the fabrication of ICs such as memory ICs. Other types of ICs are also useful. Generally, a plurality of ICs are formed on a semiconductor substrate, such as a silicon wafer, in parallel. After processing is finished, the wafer is diced to separate the ICs into individual chips. The chips are then packaged, resulting in a final product that is used in, for example, consumer products such as computer systems, cellular phones, personal digital assistants (PDAs), and other electronic products. In particular, the invention relates to alignment marks used in semiconductor processing.

Figure 1:
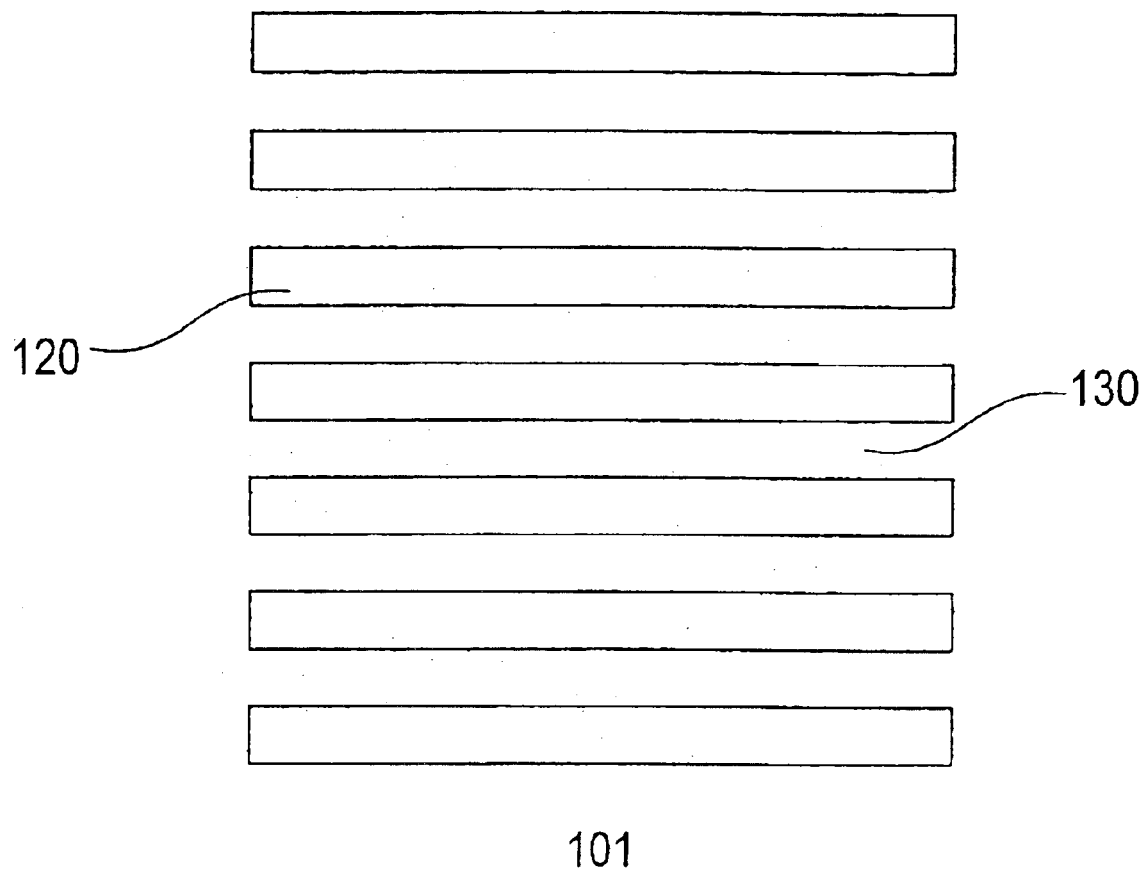
FIG. 1 shows a conventional alignment mark.
Figure 2:
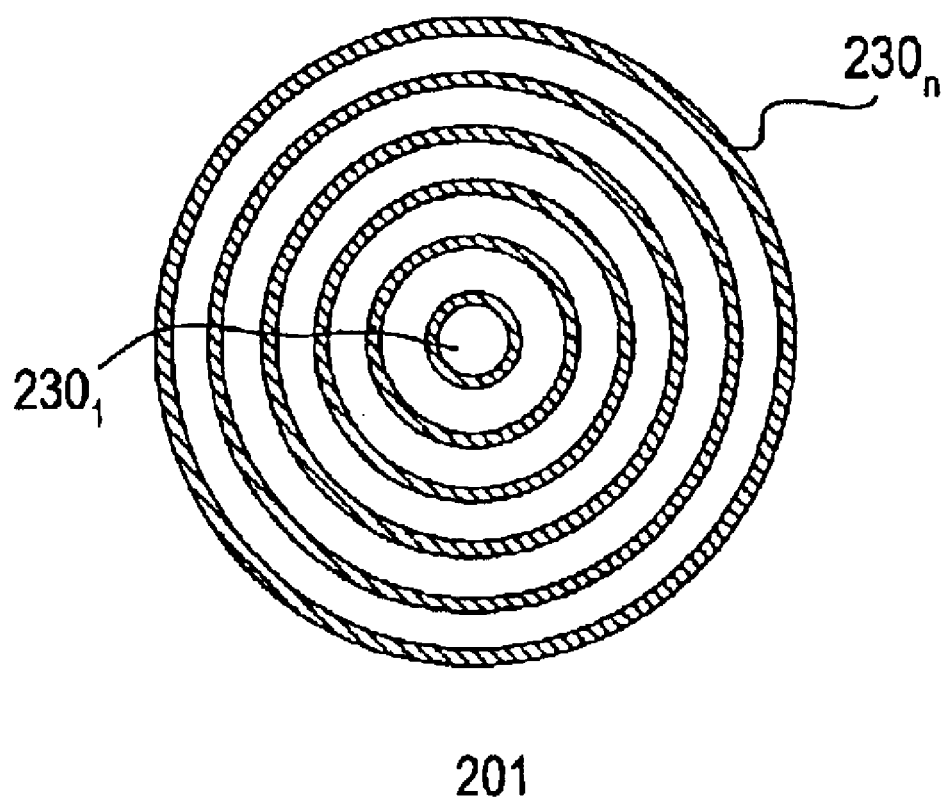
FIG. 2 shows an alignment mark in accordance with on semiconductor substrate with conventional CAP layer.

FIG. 2 shows an alignment mark in accordance with one embodiment of the invention. As shown, the alignment mark comprises at least one geometric zone plate 201. Zone plates are described in, for example, Guillermo Penate, "Zone Plate: a quasi scientific explanation" (1999), which is herein incorporated by reference for all purposes. Preferably, the alignment mark comprises a plurality of zone plates. The zone plates can be configured in a line. Other configurations, such as in forming a rectangular, circular, diamond or other geometric shapes, are also useful.

A zone plate includes a plurality of concentric geometric rings $230_{1-n}$, where n is a whole number. Preferably, n is an odd number. Providing a zone plate with n being an even number is also useful. The plurality of concentric rings are configured as alternating opaque and non-opaque rings, creating alternating opaque and non-opaque zones. In one embodiment, the odd rings (e.g., n=1, 3, 5) are opaque and the even rings (e.g., n=2, 4, 6) are transparent. Providing non-opaque odd rings and opaque even rings are also useful. The geometric rings, in one embodiment, comprise circular rings. Other types of geometric shapes are also useful.

The rings create Fresnel Zones. In one embodiment, the rings are configured such that light diffracted by successive zones cancel each other out. In other words, light diffracted by even ring numbers will cancel out light diffracted by odd ring numbers (or vice-versa). To achieve this effect, the radius of the rings is defined by the following equation: $R_n = \sqrt{(2\ nf\lambda)}$ where n is the ring number from center outwards, f is equal to the focal length (e.g., distance from the zone plate to a detector), and λ is equal to the wavelength of a laser alignment source.

In one embodiment, the zone plate is configured such that all the light diffracted by either the odd or even number zones are eliminated, thereby causing light diffracted by the other of the odd or even number zones to add. This results in an increase in irradiance, improving the signal to noise ratio (e.g., performance) of the alignment mark. In particular, the increase is equal to about 4 $n^2$. In the case where a zone plate has 20 rings (e.g., m=20), an increase of about 1600× can be obtained. An increase in signal-to-noise ratio also improves the depth of focus of the mark. This is particularly useful for advance applications which have thick layers or multiple device layers.

The increase in signal-to-noise ratio, as evidenced from the above discussion, depends on the number of rings in the zone plate. In one embodiment, the number of rings is less than or equal to 20. Zone plates with other number of rings are also useful. Keep in mind that the more rings there are in a zone plate, the larger it is. Other factors, such as f and λ, can also impact the size of the zone plate. However, the general rule is the more rings, the greater the area needed. In a preferred embodiment, the zone plate is designed to optimize depth of focus and signal-to-noise ratio requirements as well as availability of chip area. Preferably, the zone plate design also takes into account the focus budget, including focal length and/or wavelength used.

Figure 3:
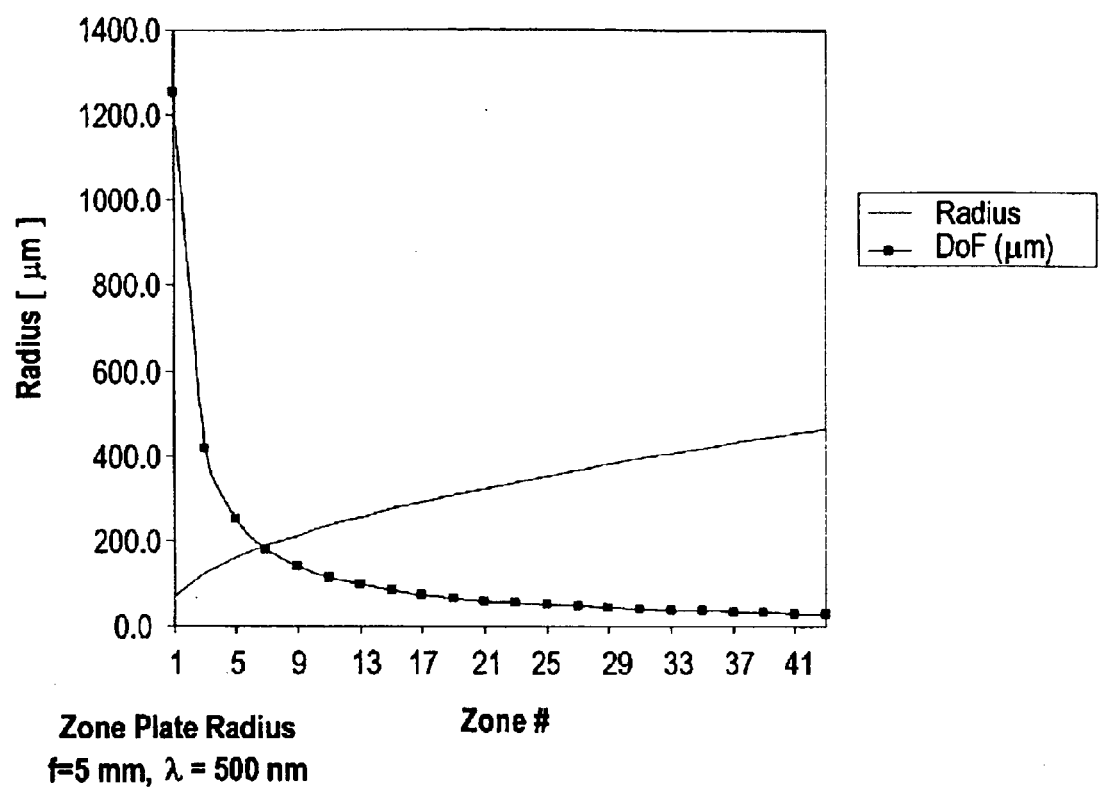
FIG. 3 shows a graph of zone plate as a function of number of rings and size as well as depth of focus.

FIG. 3 shows a graph of the size of the zone plate (radius of rings) and depth of focus, for f=5 mm and λ=500 nm. The depth of focus is equal to about f/(4 n).

The non-opaque rings comprise a non-opaque material and the opaque rings comprise an opaque material. In one embodiment, the non-opaque material comprises a dielectric material, such as silicon oxide, silicon nitride, or silicate glass. Other types of dielectric or non-opaque materials are also useful. The opaque material comprises, for example, a metal such as copper, aluminum, or tungsten. Other types of metal, alloys, or opaque materials are also useful. Preferably, the opaque and non-opaque materials are selected to maximize the mismatch in their refractive indices. More preferably, the materials are selected to maximize the mismatch in their refractive indices as well as the refractive index of the surrounding material, for example, on which the mark is formed. The selection of materials should also take into account process integration (e.g., integrating the process of forming the mark into the process flow for forming the IC). This may require a compromise between maximizing the difference in refractive indices (e.g., performance) and cost.

To form the alignment mark, a pattern is typically etched into the wafer comprising a first material using conventional lithographic techniques. Such techniques, for example, comprise depositing a photoresist layer and selectively exposing it to an exposure source. The exposed or unexposed portions of the resist are removed, leaving a mask remaining with a pattern corresponding to the mark in the desired location. The exposed wafer surface is then etched by, for example, an anisotropic etch such as reactive ion etching (RIE), thus transferring the mask pattern onto the wafer. After the wafer is patterned, the resist layer is removed. A second material is then deposited, filling the patterned portions of the wafer. Excess second material from the wafer surface is removed by, for example, chemical mechanical polish (CMP). In one embodiment, the first material comprises a non-opaque material and the second material comprises an opaque material. Alternatively, the first material is opaque while the second is non-opaque.

In another embodiment, the mark can be formed on a wafer surface comprising a third material. The third material can be opaque or non-opaque. The third material is patterned and filled with a first material. Excess material is then removed by, for example, CMP. The wafer surface is patterned again and filled with a second material. Excess second material is then removed, thus forming the mark. In one embodiment, the first material is opaque while the second material is non-opaque. Alternatively, the first material is non-opaque and the second material is opaque. Preferably, the outer ring of the mark is the opposite type of the third material. For example, the outer ring is opaque if the third material is non-opaque.

Alternatively, the alignment mark can be formed by other techniques. For example, RIE techniques can be used to form the alignment mark. Such techniques include, for example, depositing a second material onto the surface of the wafer and patterning it to form the mark. A first material is then deposited over the mark, covering the mark. Excess material is then removed to the level of the mark, exposing the mark. Optionally, the surrounding area of the mark can be removed and a third material is deposited on the surface. Excess third material is removed by, for example, CMP to the level of the mark.

The alignment mark is generally formed in the periphery of the wafer. Typically, the alignment mark comprises a plurality of zone plates. For example, an alignment mark includes about 2 to 4 zone plates. Providing an alignment mark with other number of zone plates is also useful. The zone plates can be arranged in a line. Other arrangements (e.g., forming a rectangular, circular, diamond or other geometric shapes) are also useful. Generally, several alignment marks are located on the periphery of the wafer. For example, about 2 4 alignment marks are located in different peripheral parts of the wafer. Providing other number of alignment marks on the wafer is also useful. Forming alignment marks in the periphery of the chip or die is also useful.

The marks can be formed on the wafer surface at any stage of processing. For example, the marks can be formed at the beginning of processing on the bare wafer surface (e.g., zero level). Forming marks on the wafer at other stages of processing (e.g., level=≧1) is also useful.

Figure 4:
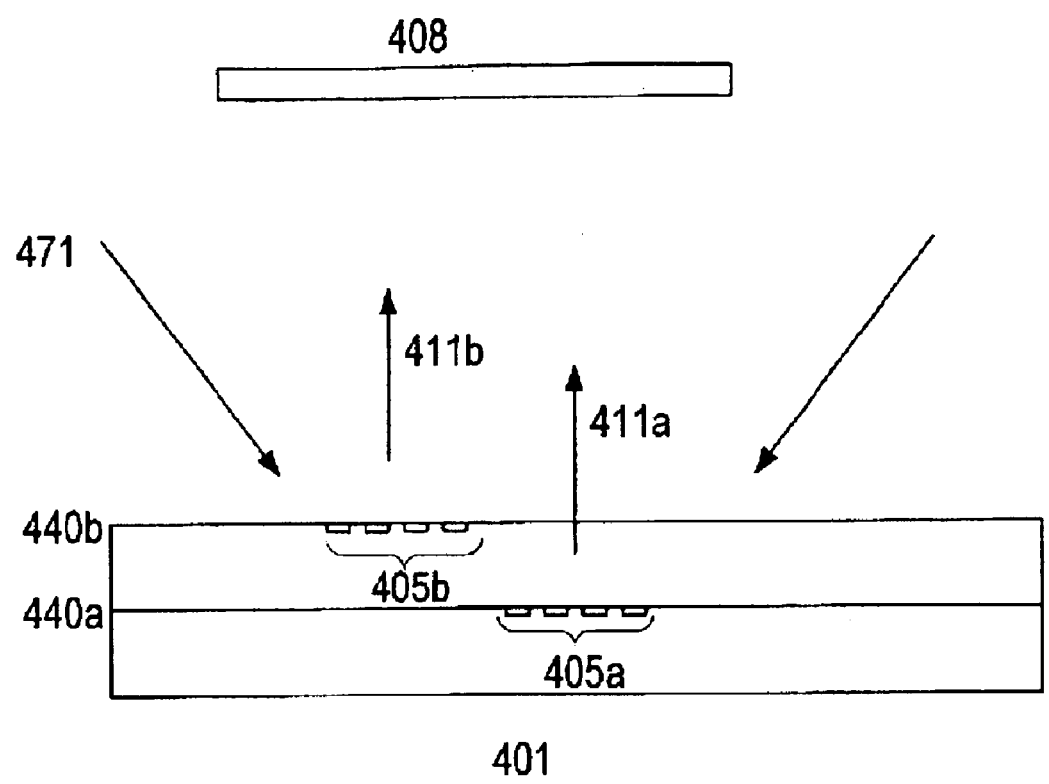
FIG. 4 shows alignment marks on different levels on a wafer for performing overlay measurements in accordance with one embodiment of the invention.

FIG. 4 shows another embodiment of the invention. As shown, a wafer 401 is provided. The wafer comprises, in one embodiment, silicon. Other types of semiconductor wafers are also useful. In one embodiment, the wafer is prepared with alignment marks 405a–b in respective first and second levels 440a–b. Each level, for example, represents a device layer or substrate. For example, the lower level can be the substrate (e.g., level zero) which includes active area, isolation trenches and trench capacitors of a DRAM array. The second level, for example, comprises an interlevel dielectric layer separating the components of the first level. It is understood that there can be additional levels above the second level and/or below the first level. Furthermore, it is not necessary that the first and second levels are contiguous levels. In one embodiment, an alignment mark comprises a plurality of plate zones, as described herein. Illustratively, an alignment mark comprises four zone plates. Providing alignment marks with other number of plate zones is also useful. The zone plates can be arranged in a line. Other arrangements (e.g., forming a rectangular, circular, diamond or other geometric shapes) are also useful. The alignment marks, in one embodiment, are located on the periphery of the wafer. Although not shown, several alignment marks can be located at the periphery of the wafer. For example, about 24 alignment marks are located in different peripheral parts of the wafer. Providing other number of alignment marks on the wafer is also useful. In one embodiment, the marks on different levels are offset. Other arrangements between alignment marks of different levels are also useful.

To perform overlay measurements between the first and second levels, an alignment source illuminates the wafer with radiation, indicated by arrows 471. In one embodiment, the alignment source comprises a laser which generates radiation. For example, an argon laser is used which generates radiation at about 500 nm wavelength. Other types of alignment source or systems can also be useful. The radiation is reflected by the alignment marks, as indicated by arrows 411a–b. The reflection is captured by a sensor 408 (e.g., a charged coupled device) which creates an image of the alignment marks. The distance between the mark and CCD device corresponds to the focal length f. The relative positions of the marks are then measured to determine the overlay accuracy. As previously described, the alignment marks of the present invention produce greater irradiance than conventional alignment marks. This enables the images of alignment marks to be more accurately captured, thus improving overlay measurement performance.

Although the whole invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A semiconductor wafer comprising:
    a first plurality of alignment marks disposed in a first level overlying a substrate, each alignment mark in the first plurality comprising a zone plate that comprises n concentric alternating opaque and non-opaque rings;
    a second plurality of alignment marks disposed in a second level that overlies the first level, each alignment mark in the second plurality comprising a zone plate that comprises n concentric alternating opaque and non-opaque rings.
2. The semiconductor wafer of claim 1 wherein n comprises an odd number.
3. The semiconductor wafer of claim 2 wherein the concentric rings comprise circular concentric rings.
4. The semiconductor wafer of claim 2 wherein light diffracted by either the odd or even rings are cancelled and the light diffracted by other of the odd or even rings which are not cancelled are added.
5. The semiconductor wafer of claim 2 wherein the radius $R_n$ of the rings is defined by square root of n ×f ×λ, where n is the ring number within the zone plate, f is equal to the focal length, and λ is equal to the wavelength of the light source.
6. The semiconductor wafer of claim 1 wherein n comprises an even number.
7. The semiconductor wafer of claim 6 wherein the concentric rings comprise circular concentric rings.
8. The semiconductor wafer of claim 6 wherein light diffracted by either the odd or even rings are cancelled and the light diffracted by other of the odd or even rings which are not cancelled are added.
9. The semiconductor wafer of claim 6 wherein the radius $R_n$ of the rings is defined by square root of n ×f ×λ, where n is the ring number within the zone plate, f is equal to the focal length, and λ is equal to the wavelength of the light source.
10. The semiconductor wafer of claim 1 wherein the concentric rings comprise circular concentric rings.
11. The semiconductor wafer of claim 10 wherein the radius Rm of the rings is defined by square root of n ×f ×λ, where n is the ring number within the zone plate, f is equal to the focal length, and λ is equal to the wavelength of the light source.
12. The semiconductor wafer of claim 10 wherein light diffracted by either the odd or even rings are cancelled and the light diffracted by other of the odd or even rings which are not cancelled are added.
13. The semiconductor wafer of claim 1 wherein the radius $R_n$ of the rings is defined by square root of n ×f ×λ, where n is the ring number within the zone plate, f is equal to the focal length, and λ is equal to the wavelength of the light source.
14. The semiconductor wafer of claim 13 wherein light diffracted by either the odd or even rings are cancelled and the light diffracted by other of the odd or even rings which are not cancelled are added.
15. The semiconductor wafer of claim 1 wherein light diffracted by either the odd or even rings are cancelled and the light diffracted by other of the odd or even rings which are not cancelled are added.
16. The semiconductor wafer of claim 1 wherein the opaque rings comprise an opaque material and the non-opaque rings comprise a non-opaque material.
17. The semiconductor wafer of claim 16 wherein the opaque material comprises a metal material and the non-opaque material comprises a non-metallic material.
18. The semiconductor wafer of claim 17 wherein the first ring comprises an opaque ring.
19. The semiconductor wafer of claim 17 wherein the first ring comprises a non-opaque ring.
20. The semiconductor wafer of claim 1 wherein the alignment marks of the first plurality are arranged in a geometric shape and the alignment marks of the second plurality are arranged in a geometric shape, the geometric shape selected from the group consisting of a rectangle, a circle and a diamond.
21. The semiconductor wafer of claim 1 wherein the alignment marks of the plurality are arranged in a line and wherein the alignment marks of the second plurality are arranged in a line.
22. The semiconductor wafer of claim 21 wherein the opaque material comprises a metal material and the non-opaque material comprises a non-metallic material.
23. The semiconductor wafer of claim 1 wherein the first ring comprises an opaque ring.
24. The semiconductor wafer of claim 1 wherein the first ring comprises a non-opaque ring.
25. An alignment mark for processing comprising a zone plate formed on a substrate, the zone plate comprises n concentric alternating opaque and non-opaque rings, wherein the zone plate increases signal-to-noise ratio of the alignment over conventional alignment marks, wherein the opaque rings comprise an opaque material and the non-opaque rings comprise a non-opaque material, the alignment mark further comprising additional zone plates, wherein the zone plate and the additional zone plates are arranged in a line or other geometric shape, and wherein the first ring comprises an opaque ring.
26. An alignment mark for processing comprising a zone plate formed on a substrate, the zone plate comprises n concentric alternating opaque and non-opaque rings, wherein the zone plate increases signal-to-noise ratio of the alignment over conventional alignment marks, wherein the opaque rings comprise an opaque material and the non-opaque rings comprise a non-opaque material, the alignment mark further comprising additional zone plates, wherein the zone plate and the additional zone plates are arranged in a line or other geometric shape, and wherein the first ring comprises a non-opaque ring.

27. In processing, a method of forming a semiconductor device comprising:

providing a substrate;

forming a first alignment mark over the substrate, the alignment mark comprising a zone plate having n concentric alternating opaque and non-opaque rings;

forming a second alignment mark in a layer that overlies the first alignment mark, the second alignment mark comprising a zone plate having n concentric alternating opaque and non-opaque rings; and determining a relationship between relative lateral positions of the first and second alignment marks.

28. The method of claim 27 wherein determining the relationship between relative lateral positions comprises:

illuminating the substrate with radiation.

reflecting the radiation from the first and second alignment marks;

creating an image of the alignment marks from the reflected radiation; and measuring the relative positions of the marks to determine an overlay accuracy.

29. The method of claim 28 wherein the radiation comprises laser radiation.

30. The method of claim 29 wherein the radiation comprises radiation from an argon laser which generates radiation at about 500 nm wavelength.

31. The method of claim 28 wherein creating an image comprises capturing the reflected radiation in a charge-coupled device (CCD).

32. The method of claim 27 wherein forming a first alignment mark comprises simultaneously forming the first alignment mark and additional alignment marks in the first level and wherein forming a second alignment mark comprises simultaneously forming the second alignment mark and additional alignment marks in the second level.

33. A method of aligning wafer to a mask, the method comprising:

providing a wafer prepared with a plurality of alignment marks arranged at the periphery of active circuitry, wherein each alignment mark comprises a zone plate having n concentric alternating opaque and non-opaque rings;

detecting the alignment marks with an alignment system; and moving either the wafer or mask into position based on the alignment marks.

34. The method of claim 33 wherein the plurality of alignment marks are arranged around the periphery of the wafer.

35. The method of claim 33 wherein the plurality of alignment marks are arranged around the periphery of a die on the wafer.

36. The method of claim 33 wherein the plurality of alignment marks are arranged in a line.

37. The method of claim 33 wherein the plurality of alignment marks are arranged in a geometric shape, the geometric shape being selected from the group consisting of a rectangle, a circle and a diamond.

* * * * *

UNITED STATES PATENT AND TRADEMARK OFFICE
CERTIFICATE OF CORRECTION

PATENT NO. : 6,888,260 B2
DATED : May 3, 2005
INVENTOR(S) : Carpi et al.

It is certified that error appears in the above-identified patent and that said Letters Patent is hereby corrected as shown below:

Column 2,
Line 6, delete "mxfxλ" and insert -- m x f x λ --.

Column 5,
Lines 49 and 62, delete "xf xλ" and insert -- x f x λ --.

Column 6,
Lines 2 and 11, delete "xf xλ" and insert -- x f x λ --.

Signed and Sealed this

Sixteenth Day of August, 2005

JON W. DUDAS
*Director of the United States Patent and Trademark Office*